US005783340A

United States Patent [19]

Farino et al.

[11] Patent Number: 5,783,340
[45] Date of Patent: Jul. 21, 1998

[54] METHOD FOR PHOTOLITHOGRAPHIC DEFINITION OF RECESSED FEATURES ON A SEMICONDUCTOR WAFER UTILIZING AUTO-FOCUSING ALIGNMENT

[75] Inventors: Anthony J. Farino; Stephen Montague; Jeffry J. Sniegowski; James H. Smith; Paul J. McWhorter, all of Albuquerque, N. Mex.

[73] Assignee: Sandia Corporation, Albuquerque, N. Mex.

[21] Appl. No.: 903,985

[22] Filed: Jul. 31, 1997

Related U.S. Application Data

[63] Continuation-in-part of Ser. No. 524,700, Sep. 6, 1995.
[51] Int. Cl.⁶ .............................. G01B 11/00; G03F 9/00
[52] U.S. Cl. .......................... 430/22; 430/311; 430/314; 430/315; 430/319; 356/400; 438/24
[58] Field of Search ........................ 430/22, 311, 314, 430/315, 319; 356/399, 400, 401; 438/24

[56] References Cited

U.S. PATENT DOCUMENTS 4,580,900  4/1986  Larse ........................................ 356/400
4,615,621  10/1986  Allen ........................................ 356/399
4,814,829  3/1989  Kosugi ...................................... 355/43

Primary Examiner—Christopher G. Young
Attorney, Agent, or Firm—John P. Hohimer

[57] ABSTRACT

A method is disclosed for photolithographically defining device features up to the resolution limit of an auto-focusing projection stepper when the device features are to be formed in a wafer cavity at a depth exceeding the depth of focus of the stepper. The method uses a focusing cavity located in a die field at the position of a focusing light beam from the auto-focusing projection stepper, with the focusing cavity being of the same depth as one or more adjacent cavities wherein a semiconductor device is to be formed. The focusing cavity provides a bottom surface for referencing the focusing light beam and focusing the stepper at a predetermined depth below the surface of the wafer, whereat the device features are to be defined. As material layers are deposited in each device cavity to build up a semiconductor structure such as a microelectromechanical system (MEMS) device, the same material layers are deposited in the focusing cavity, raising the bottom surface and re-focusing the stepper for accurately defining additional device features in each succeeding material layer. The method is especially applicable for forming MEMS devices within a cavity or trench and integrating the MEMS devices with electronic circuitry fabricated on the wafer surface.

27 Claims, 15 Drawing Sheets

METHOD FOR PHOTOLITHOGRAPHIC DEFINITION OF RECESSED FEATURES ON A SEMICONDUCTOR WAFER UTILIZING AUTO-FOCUSING ALIGNMENT

CROSS REFERENCE TO RELATED APPLICATIONS

This is a continuation-in-part of co-pending application Ser. No. 08/524,700, filed Sep. 6, 1995. That application is herein incorporated by reference.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to photolithography for forming integrated circuits, microelectromechanical systems or the like, and more specifically to a method for photolithographically defining device features at high resolution when the device features are to be formed in a wafer cavity about 2 microns ($\mu$m) or more below the surface of a semiconductor wafer.

BACKGROUND OF THE INVENTION

Photolithographic processes are essential for defining devices for semiconductor integrated circuits (ICs) and many classes of microelectromechanical systems (MEMS). Photolithographic stepper exposure systems (termed "steppers") project an optical or x-ray image from a reticle or mask to expose a layer of a photoresist layer blanketing a semiconductor wafer. The exposed photoresist layer is used to define device features to be formed on the wafer or in a material layer thereon by subsequent processing steps such as etching, ion implantation, deposition, metal plating or the like that are well known to the semiconductor industry.

As device dimensions become increasingly smaller, the ability to accurately focus a projected reticle image at the surface of a semiconductor wafer for photolithography becomes more critical. To this end, automatic focusing and alignment systems have been developed for steppers. Automatic focusing can be achieved by providing an focusing light beam (e.g. from a laser or light-emitting diode) incident on the surface of the semiconductor wafer to illuminate a small spot at a predetermined location, generally near the center of a die field defined by the projected reticle image. Light reflected or scattered from the wafer surface in the form of a reflected light beam can then be used to accurately measure the position of the surface, providing a detected signal that can be used to adjust the vertical position or height of the wafer to coincide with a focal plane of the projected image. Additional light beams can be used to locate alignment marks on the surface of the wafer and to automatically align these marks to other alignment marks on a particular reticle. Through-the-lens photolithography systems have been disclosed in U.S. Pat. No. 4,580,900 to Larsen, and in U.S. Pat. No. 4,615,621 to Allen et al. An around-the-lens photolithography system is disclosed in U.S. Pat. No. 4,814,829 to Kosugi et al.

In the case of a high numerical aperture (N.A.) projection stepper capable of defining sub-micron device features, the tolerance (i.e. depth of focus) for vertical positioning of the wafer surface can be on the order of about 2 microns or less. If topography variations on the wafer exceed the stepper's depth of focus above or below the focal plane, the projected image at those locations on the wafer will not be in focus so that any device features photolithographically defined by the stepper will be degraded. Furthermore, when a conventional projection stepper is used that automatically focuses at the surface of a semiconductor wafer, there has been heretofore no known way to define device features at a resolution limit of the stepper when those device features are to be defined within a cavity or trench having a depth exceeding the depth of focus of the stepper.

An advantage of the method of the present invention is that topographic limitations can be overcome so that device features can be precisely defined in a cavity up to 20 microns or more below the surface of a semiconductor wafer using a conventional auto-focusing photolithographic exposure system.

A further advantage is that the method of the present invention provides a means for using a conventional auto-focusing projection stepper to precisely fabricate one or more devices within a cavity on a semiconductor wafer, and to form on the same wafer other devices located on or above the wafer surface.

Another advantage of the method of the present invention is that large topographical variations across a semiconductor wafer can be accommodated and need not be a hindrance to precisely forming devices with features having one or more lateral dimensions about equal to a resolution limit of a photolithographic projection stepper. In the case of a high numerical aperture (i.e. 0.3–0.6 numerical aperture) stepper, the device features can have a lateral dimension as small as one micron or less.

These and other advantages of the method of the present invention will become evident to those skilled in the art.

SUMMARY OF THE INVENTION

The present invention relates to a method for photolithographically defining device features recessed below a surface of a semiconductor wafer (i.e. substrate) using an automatic focusing (hereafter auto-focusing) photolithographic stepper exposure system (hereafter stepper) and a product formed by such method. The method comprises the steps of forming a plurality of equal-depth cavities within a die field on a top surface of a semiconductor wafer, including a focusing cavity formed at a predetermined position of a focusing light beam from the auto-focusing stepper and at least one device cavity proximate to the focusing cavity; forming a first material layer within each cavity, thereby raising a bottom surface of each cavity by a thickness of the first material layer; covering the material layer with a photoresist layer; focusing the stepper by reflecting the focusing light beam off the material layer in the focusing cavity and generating a detected light signal for vertically positioning the bottom surface of each cavity at a focal plane of the stepper; and exposing the photoresist layer for photolithographically defining the recessed device features to be formed in the material layer within the device cavity. The method can include further steps for building up a device structure in the device cavity by depositing or forming additional material layers of predetermined thicknesses and compositions within the focusing and device cavities, each additional material layer being photolithographically defined by a photoresist layer provided thereover, and each additional material layer further raising the bottom surface of each cavity so that the semiconductor wafer is vertically repositioned in the stepper by the detected light signal to locate the bottom surface of each cavity at the focal plane of the stepper prior to exposing the photoresist layer and defining the device features. Finally, the method can include steps for providing one or more alignment marks within the die field, preferably within the focusing cavity, and laterally aligning the wafer to a projected reticle image prior to exposing each photoresist layer.

The method of the present invention has particular applicability to forming microelectromechanical system (MEMS) devices with or without associated electronic circuitry being formed on the semiconductor wafer. The method allows the formation of device features in MEMS devices with submicron lateral dimensions, which has not been possible heretofore when device features are recessed below the surface of a semiconductor wafer at a depth exceeding the depth of focus of a stepper. Additionally, the method of the present invention can be applied for fabricating other types of semiconductor devices such as dynamic random access memory (DRAM) chips wherein a plurality of capacitors are to be formed in trenches, or for fabricating multi-level interconnects at high resolution in an IC.

As applied to the formation of a MEMS device within a cavity below the surface of a semiconductor wafer, the method of the present invention comprises steps for forming a plurality of equal-depth cavities within a die field on the semiconductor wafer, including a focusing cavity located at a predetermined position in the die field corresponding to the position of a focusing light beam from an auto-focusing photolithographic stepper, and at least one device cavity wherein the MEMS device is to be formed; depositing a plurality of material layers, one layer at a time, into the focusing and device cavities; forming a patterned mask over each material layer for defining features of the MEMS device within the material layer by automatically focusing the stepper at a top surface of the material layer (i.e. the bottom surface of the focusing cavity) in the focusing cavity; and etching the material layer through the patterned mask to form the features of the MEMS device within the device cavity. The method can further include steps for forming electronic circuitry on the surface of the semiconductor wafer and interconnecting the electronic circuitry with the MEMS device.

Additional advantages and novel features of the invention will become apparent to those skilled in the art upon examination of the following description, or can be learned by practice of the invention. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
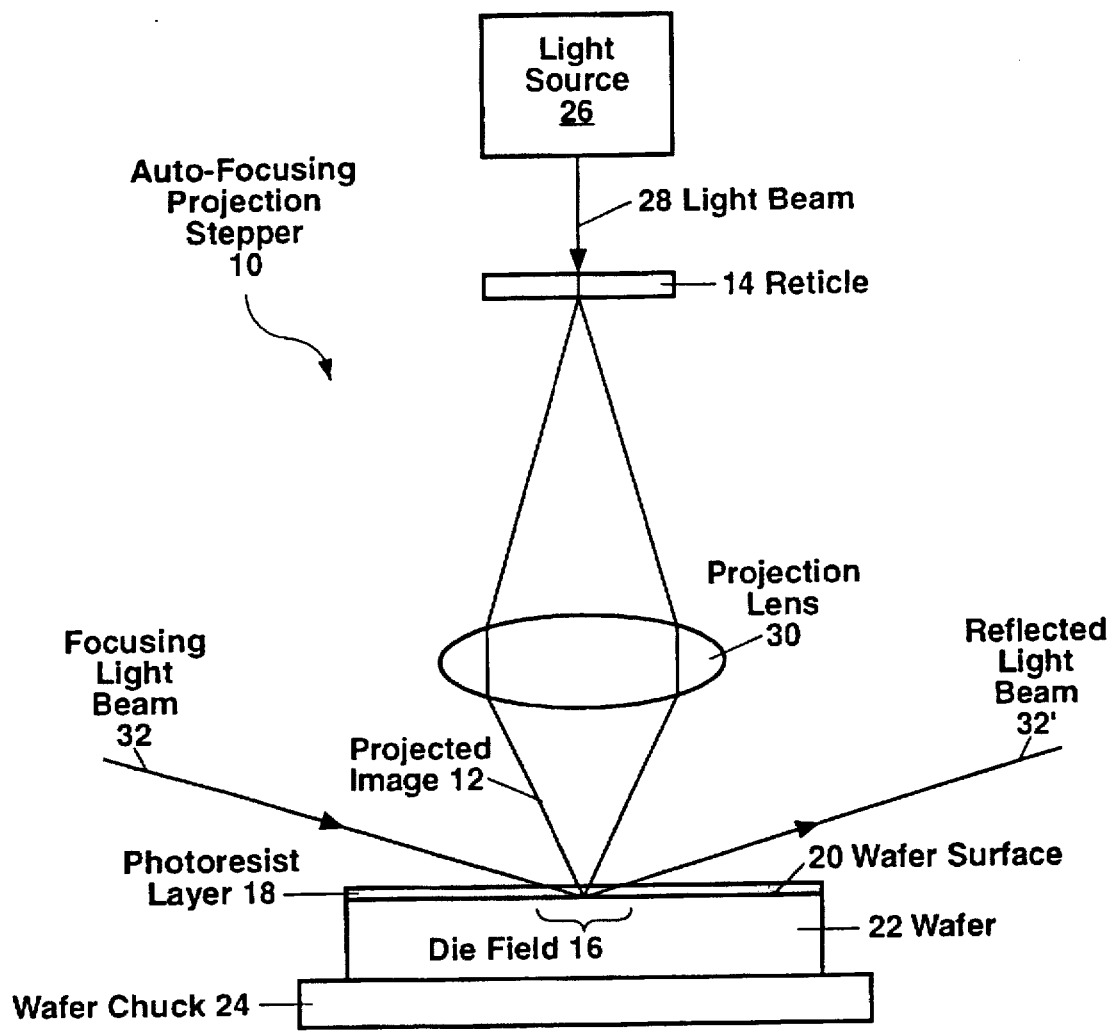
FIG. 1 shows schematically an auto-focusing stepper for projecting a reticle image onto a surface of a semiconductor wafer.

Referring to FIG. 1, there is shown schematically a conventional auto-focusing projection stepper 10. The projection stepper 10 is used to project an image 12 from a reticle 14 onto an image die field 16 to expose a thin photoresist layer 18 blanketing a top surface 20 of a semiconductor substrate or wafer 22 mounted on a moveable stage or wafer chuck 24. Alternately, the photoresist layer 18 can be provided above a material layer (e.g. polysilicon, silicon dioxide, silicon nitride, glass, polyimide, metals or metal alloys) that is formed or deposited above the top surface 20 in order to photolithographically define one or more device features in the material layer.

In FIG. 1, the projection stepper 10 uses a light source 26 to produce light beam 28 to form the projected image 12 using projection lens 30. A vertical position of the semiconductor wafer 22 is adjusted so that a focal plane of the projected image 12 coincides with the wafer surface 20 to provide optimum focusing conditions. Additionally, the wafer 22 is adjusted laterally to align the projected image 12 with one or more alignment marks provided on the wafer 22 or on a material layer thereabove.

The projection lens 30 in FIG. 1 generally has a high numerical aperture (N.A.) of about 0.3–0.6 to provide an image resolution approaching the wavelength of light beam 28 which is less than one micron. As a result, feature sizes with a lateral dimension of less than about one micron can be defined in photoresist layer 18 and transferred by subsequent processes to the wafer 22 or to a material layer thereabove. Although a visible or ultraviolet light source 26 is generally used today, projection steppers based on x-ray light sources are currently being developed to produce even smaller feature sizes.

In FIG. 1, there is a direct correlation between a minimum feature size that can be photolithographically defined and a depth of focus of the projection lens 30. The minimum feature size and the depth of focus are set by the wavelength of the light source 26 and the N.A. of the projection lens 30. For a high N.A. (0.3–0.6 N.A.) projection lens 30 and a <1 μm light source, the depth of focus for the projected image 12 is about 2 microns. If topography variations across the image die field 16 are larger than the 2-μm depth of focus, some device features photolithographically defined by the stepper 10 will be degraded due to the projected image 12 being out-of-focus (i.e. outside the depth of focus). This can result, for example, when the photoresist layer 18 covers a non-planar layer that has been previously patterned, or when adjacent device features are to be defined at different levels. Thus, to form device features at the minimum feature size (i.e. at a resolution limit of the stepper 10), topography variations across the die field 16 must be limited to the depth of focus of the stepper 10.

To obtain optimal performance, a projection stepper 10 preferably includes an automatic focusing capability to vertically position the wafer surface 20 (or a material layer located thereabove) at the focal plane of the stepper 10 (i.e. within the depth of focus of projection lens 30). In one embodiment, auto-focusing can be provided as shown in FIG. 1 by reflecting an incident focusing light beam 32 from a laser or light-emitting diode (LED) off the top surface 20 of the wafer 22, with the focusing light beam 32 generally being focused to a spot size of ≦50 μm at or near the center of die field 16. To prevent the focusing light beam 32 from exposing a layer of photoresist 18 provided above the wafer surface 20, the wavelength of the focusing beam 32 can be selected to be larger than the wavelength of the light beam 28 to which the photoresist layer 18 is photosensitive.

In FIG. 1, a reflected light beam 32' (generated by the reflection of incident light beam 32 from the wafer surface 20) can be detected with a photodetector (not shown) to provide a detected light signal for vertically positioning (i.e. servoing) the wafer chuck 24 for automatically focusing the projected image 12 at the wafer surface 20. Since the thickness of the photoresist layer 18 is generally less than the depth of focus, this thickness can either be ignored or else taken into account in determining the vertical position of stage 24 for optimal focusing of the projected image 12. As a plurality of material layers (not shown) are formed or deposited above the substrate 22 to form a particular device structure, the focusing light beam 32 can be reflected off each succeeding material layer, subject to limitations on image resolution due to topography variations across the die field 16.

The method of the present invention allows the limitations on image resolution due to topography variations across the die field 16 to be overcome and is particularly applicable to the formation of a device within a cavity below the surface 20 of the semiconductor wafer 22. The present method can be understood with the aid of FIG. 2 which shows schematically a portion of a semiconductor wafer 22 centered about die field 16 containing a plurality of cavities therein. As used herein, the term "cavity" is intended to refer to any shaped recess or depression formed by etching with a depth of ≧2 microns, and includes a trench. A "cavity" will generally be formed below a top surface 20 of a semiconductor wafer 22; but, can also be formed within a material layer grown, formed or deposited above the surface 20 of the wafer 22. For clarity, elements of the projection stepper 10 other than the focusing light beam 32 and reflected light beam 32' are omitted from FIG. 2.

Figure 2:
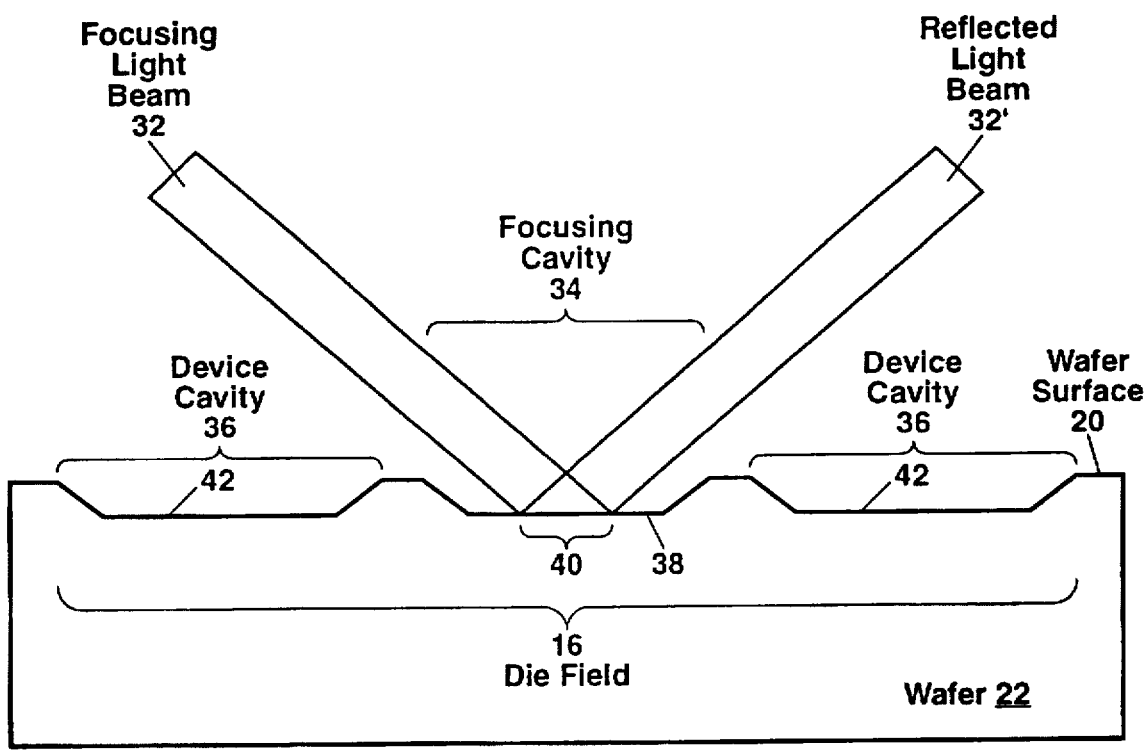
FIG. 2 shows schematically a semiconductor wafer having formed therein first and second cavities according to the present invention.

In FIG. 2, the wafer 22 can be prepared according to the method of the present invention to provide a first cavity 34 (termed a focusing cavity) for use in focusing stepper 10 to provide a focal plane at a predetermined distance below the surface 20 of wafer 22 wherein device features are to be formed within one or more second cavities 36 (termed device cavities). The focusing cavity 34 functions to record the vertical position of a top surface of each material layer (excluding photoresist layers) deposited or formed within the device cavities 36 and to convey this positional information by means of the focusing and reflected light beams, 32 and 32', to the stepper 10 so that the vertical position of the wafer 22 can be automatically adjusted to locate the top surface of each material layer in the device cavities 36 at the focal plane of the stepper 10. Additionally, the focusing cavity 34 can include alignment marks for laterally positioning the wafer 22 manually or automatically (by providing additional light beams to reflect off the alignment marks for locating their position and adjusting a lateral position of the wafer 22).

The method of the present invention solves the problem of forming devices with large topological variations that exceed the depth of focus of an auto-focusing projection stepper 10. With the present method, devices including microelectromechanical systems (MEMS) can be formed in a device cavity 36 that is deeper than the depth of focus of a stepper (e.g. ≧2–20 μm deep), with the devices having lateral dimensions as small as the resolution limit of the projection stepper 10. After formation of the MEMS device, electronic circuitry can be formed on or above the surface 20 of the wafer, also up to the resolution limit of the stepper 10. Furthermore, according to the teaching of the present invention, any types of semiconductor devices known to the art can be formed with feature sizes as small as the resolution limit of a projection stepper 10 when different of the semiconductor devices are to be located at different levels separated by a vertical distance that exceeds the depth of focus of the stepper 10.

In FIG. 2, the wafer 22 is initially masked and patterned by etching to form a series of equal-depth open cavities with a predetermined depth exceeding the depth of focus of the projection stepper 10. Alignment marks can be provided on the wafer surface 20 for use in defining the locations of the open cavities, for locating additional alignment marks within the focusing cavity 34, and for later forming optional electronic circuitry above the surface 20 of the wafer 22.

The size and location of each cavity in FIG. 2 can be predetermined and defined by a series cavity-forming process steps as described hereinafter. Although the first and second cavities, 34 and 36, can be independently formed using different process steps, it is generally advantageous to form the first and second cavities simultaneously so that depth of the first and second cavities can be made equal to provide co-planar bottom surfaces for each cavity. Those skilled in the art will understand from the teachings herein that, although the first and second cavities are preferably of equal depth, these cavities can also be made with unequal depths if the difference in depths of the first and second cavities is less than the depth of focus of the projection stepper 10 and is taken into account by the stepper 10 when vertically positioning the wafer to properly focus the image plane at the bottom surface of the second cavity, or at the top surface of a material layer therein.

In FIG. 2, the cavities are etched into the wafer 22 to the predetermined depth. The cavities, including the focusing cavity 34 located within the die field 16 at a predetermined position corresponding to the location of the incident focusing light beam 32 and at least one second cavity 36 located proximate to the focusing cavity 34, are formed by wet or dry etching. A preferred method for forming the cavities 34 and 36 is to use a bulk micromachining process after providing a patterned masking layer (e.g. about 500 nanometers of a silicate glass deposited from the decomposition of tetraethylortho silicate, also termed TEOS, that has been densified by high temperature processing) covering the top surface 20 of a bare wafer 22 with openings provided at the locations of each cavity to be formed. Each cavity can then be etched into the wafer 22 using an anisotropic wet etchant such as potassium hydroxide (KOH), tetramethyl ammonium hydroxide (TMAH) or ethylenediamine pyrocatechol (EDP) to form the cavities 34 and 36 with a depth of about 2–20 μm or more. The anisotropic wet etchant provides a planar mirror-like bottom surface for each cavity, with the bottom surface of the focusing cavity 34 (termed the first surface 38) being located and sized to fit a footprint or spot size 40 of the focusing light beam 32 as shown in FIG. 2. After formation of the cavities 34 and 36 in the wafer 22, the patterned masking layer can be removed with a selective etchant (e.g. a 6:1 buffered oxide etchant comprising HF).

Sloping sidewalls can also be formed in each cavity by the anisotropic wet etchant (e.g. oriented along (111) crystallographic planes for a silicon wafer 22). The sloping sidewalls provided can be advantageous for accommodating the focusing and reflected light beams, 32 and 32', for reducing light scattering at The edges of the focusing cavity 34, and for improving optical access to the bottom of the cavities, 34 and 36, to increase the latitude for subsequent photolithography steps for defining device features or alignment marks therein. The use of a dry etch process would generally result in straight sidewalls for the cavities 34 and 36.

Without the focusing cavity 34 in FIG. 2, the incident focusing light beam 32 would reflect off of the wafer surface 20 so that the focal plane of the projected image 12 would be automatically focused by the stepper at the wafer surface 20. As a result, any device features to be formed within the device cavity 36 beyond the depth of focus of the stepper 10 would be poorly defined since the projected reticle image 12 would be out-of-focus at the location of these device features. Such poorly defined device features due to an out-of-focus projected image 12 are disadvantageous and can impair the functionality of a semiconductor device such as a MEMS device formed within the device cavity 36.

Therefore, an essential requirement of the present invention for forming recessed device features at or near the resolution limit of a projection stepper 10 is the provision of a focusing cavity 34 (i.e. the first cavity) at a location within the die field 16 (generally at the center of the die field) corresponding to the location of the focusing light beam 32 from the stepper 10. The focusing cavity 34 and one or more device cavities 36 wherein recessed devices are to be formed are of equal depth so that a first bottom surface (i.e. a first surface 38 which can be the top surface of a material layer within the cavity 34) of the focusing cavity 34 is substantially co-planar with a second bottom surface (i.e. a second surface 42 which can be the top surface of a material layer within the cavity 36) in each device cavity 36.

The focusing cavity 34 then provides a reference level (i.e. the first surface 38) that is recessed below the wafer surface 20 so that the incident focusing light beam 32 in being reflected off the first surface 38 provides a detected light signal to vertically position the wafer 22 so that the second surface 42 of each device cavity 36 coincides with the focal plane of the projected reticle image 12, thereby allowing device features to be photolithographically defined in the device cavity 36 at or near the resolution limit of the stepper 10.

The method of the present invention is presented by way of example hereinafter using FIGS. 3–15 which show a series of process steps for fabricating a MEMS device (e.g. an accelerometer) in the device cavity 36 and integrating the MEMS device with electronic circuitry formed on the surface 20 of the same wafer 22. Typically the fabrication process for forming a MEMS device integrated with electronic circuitry can comprise up hundreds of individual steps. Only the handful of steps that are relevant to the present invention are discussed herein. Furthermore, this example is provided by way of illustration only, and is not meant to limit the present invention. Those skilled in the art will understand operation of the method of the present invention based on this example and will recognize that the present method is applicable to the formation of other types of semiconductor devices and structures having topographical variations that exceed the depth of focus of a projection stepper, and especially to devices and structures recessed in a cavity below the surface of a wafer by a distance greater than the depth of focus of a particular projection stepper.

Figure 3:
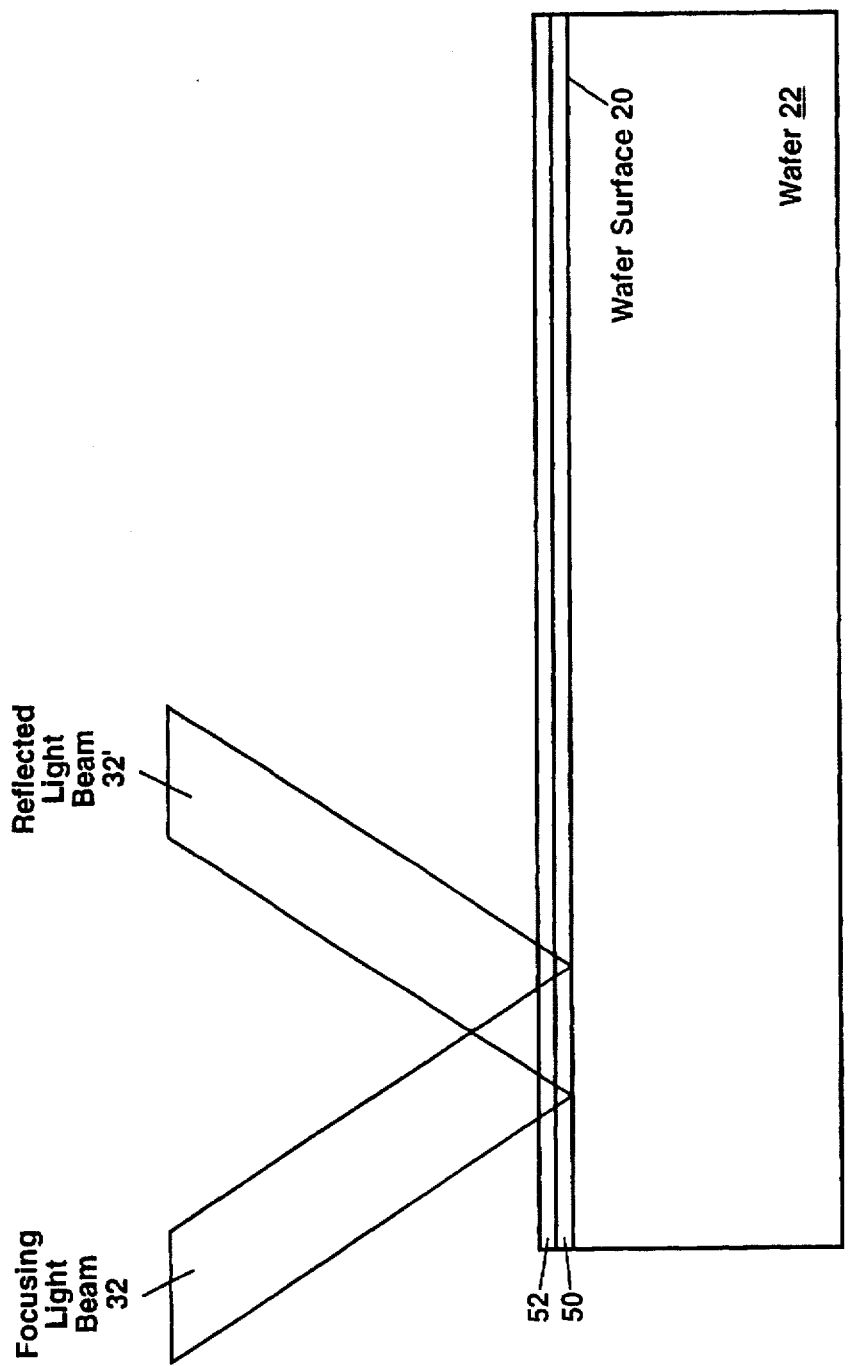
FIGS. 3–15 show a series of steps for forming a microelectromechanical system (MEMS) device integrated with electronic circuitry according to the method of the present invention.

FIG. 3 shows a portion of a die field 16 on a monocrystalline silicon wafer 22 on which the integrated MEMS device and electronic circuitry are to be formed. The wafer 22 can be either doped (i.e. n- or p-type doped) or undoped depending upon a particular type of semiconductor device and/or electronic circuitry to be formed and a particular set of process steps to be used. The wafer 22 as defined herein can further include a surface or buried epitaxial silicon layer of generally about 2–10 µm thickness to provide high-quality material for forming the semiconductor device or for forming electronic circuitry upon the wafer surface 20. A surface epitaxial silicon layer can be used for forming CMOS (complementary metal oxide semiconductors electronic circuitry, whereas a buried silicon layer can be used to form bipolar electronic circuitry including BiCMOS (bipolar CMOS) circuitry.

In FIG. 3, the surface 20 of the semiconductor wafer 22 is initially blanketed with a first masking layer 50 (e.g. about 500 nanometers of a silicate glass such as TEOS that has been densified by heating to a high temperature for a specified period of time). A first photoresist layer 52 is spun onto the wafer 22 over the first masking layer 50 and the wafer is loaded onto the wafer chuck 24 of an auto-focusing projection stepper 10 to expose the first photoresist layer 52 for defining the locations of a plurality of open cavities 34 and 36 within the wafer 22. The auto-focusing stepper 10 uses an incident focusing light beam 32 and a reflected light beam 32' generated therefrom to automatically vertically position (i.e. focus) the wafer surface 20 at a focal plane of a projected reticle image 12. (For simplicity, only the light beams 32 and 32' from the stepper 10 are shown in FIGS. 3–15.)

Figure 4:
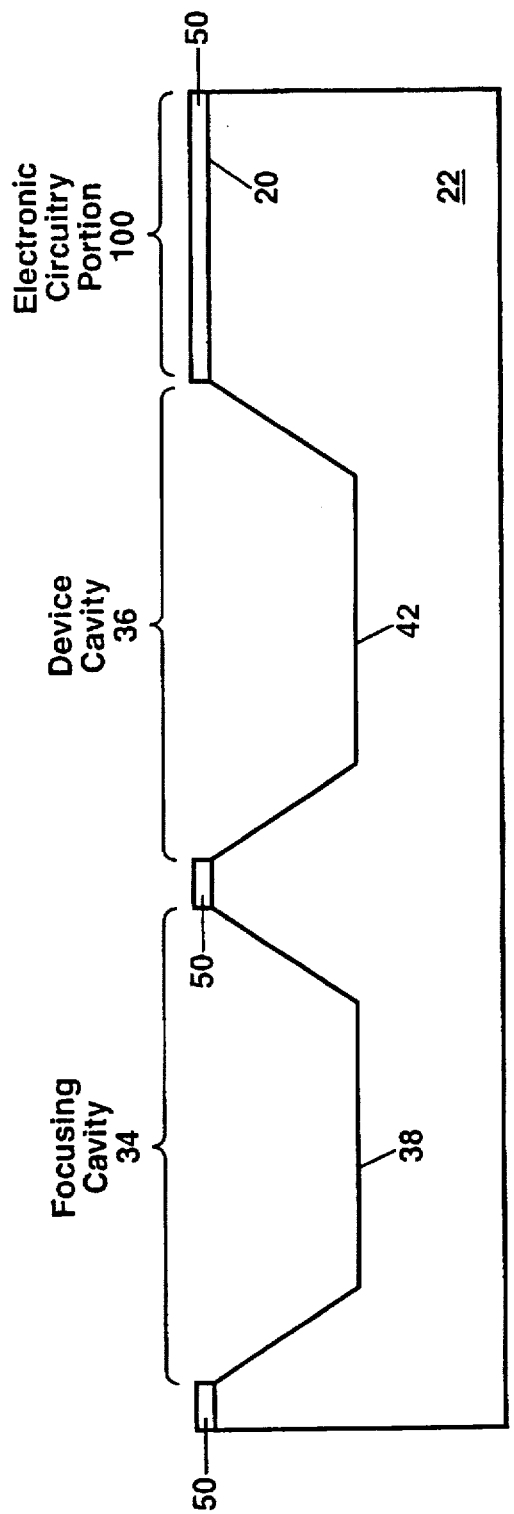

FIG. 4 shows the wafer 22 after patterning the first masking layer 50 and etching of the open cavities 34 and 36. The cavities 34 and 36 can be formed as described heretofore, preferably using an anisotropic wet etchant such as KOH, TMAH or EDP to form the cavities with sloping sidewalls. The cavities 34 and 36 are of equal depth with co-planar first and second bottom surfaces, 38 and 42. To form an embedded MEMS accelerometer from two layers of deposited polysilicon, as in the present example, a cavity depth of about 6 µm is sufficient. For other types of MEMS devices (e.g. with pressure diaphragms, electrostatic motors, gears, linkages etc.), the open cavities 34 and 36 can be up to about 20 µm or more deep. After forming the cavities 34 and 36, the patterned first masking layer 50 is removed with a buffered oxide etchant (BOE) comprising hydrofluoric acid (HF).

In FIG. 4, the first cavity 34 is used as a focusing cavity for focusing of the projection stepper 10 for forming the MEMS device within the second cavity 36 (i.e. the device cavity). Adjacent to the device cavity 36 is a portion 100 of die field 16 that is reserved for forming electronic circuitry for controlling the MEMS device or for processing information therefrom. For clarity, the focusing cavity 34 and the device cavity 36 are shown larger than the electronic circuitry portion 100, although this is generally not the case. The focusing cavity 34 will generally have lateral dimensions of about 50–1000 µm or more depending upon the spot size 40 of the incident light beam 32 and whether or not alignment marks are to be provided within the focusing cavity. The size of the focusing cavity 34 should also preferably be large enough to accommodate slight variations in the focusing light beam 32 from one stepper 10 to another stepper.

The size of the device cavity 36 will depend upon the type and complexity of a particular MEMS device to be formed and can be up to a few millimeters lateral dimensions. Since only a portion of the die field 16 is shown in FIGS. 3–15 for simplicity, additional device cavities 36 and/or circuitry which are not shown in FIGS. 4–15 can be located proximate to the focusing cavity 34 which is located at the position of the incident light beam 32, and preferably near the center of the die field 16.

Figure 5:
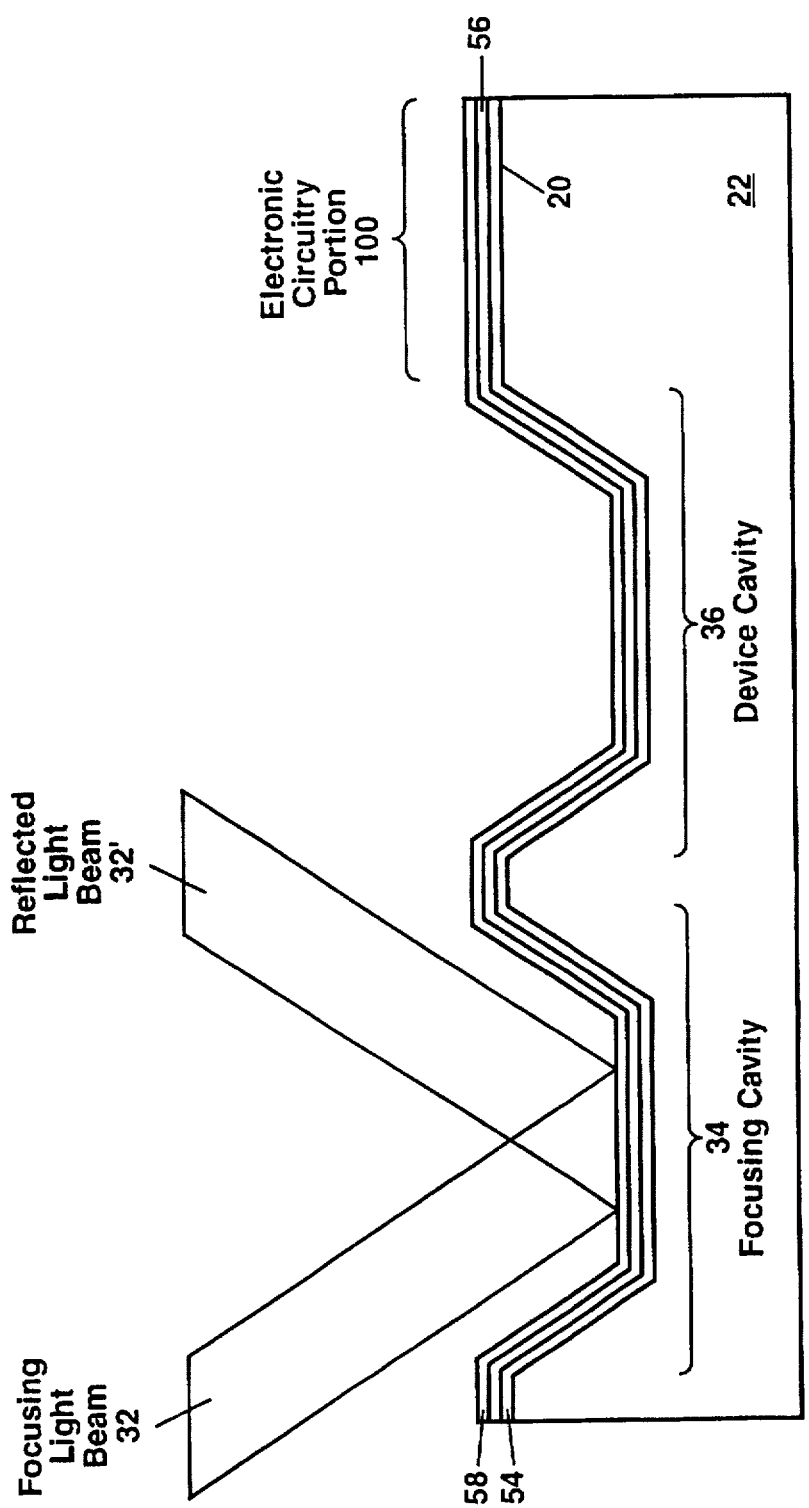

In FIG. 5, a first nitride layer 54 comprising silicon nitride is deposited to blanket the wafer surface 20 and the open cavities 34 and 36 after first forming a thin blanket (about 60 nanometers thick) of a thermal oxide (not shown) by a thermal diffusion process to protect the underlying silicon from contact with the first nitride layer 54. The first nitride layer 54 generally has a layer thickness of about 200–300 nanometers, and can be formed with a low residual stress using a low-pressure chemical vapor deposition (LPCVD) process.

A portion of the first nitride layer 54 that above the wafer surface 20 can later be used to provide a stop for a chemical-mechanical polishing (CMP) process for planarizing the top side of the wafer 22. The first nitride layer 54 is deposited in the device cavity 36 to provide dielectric isolation for the MEMS device to be formed in the cavity 36 and also acts as an etch stop for later releasing the MEM device by etching away one or more sacrificial oxide layers (e.g. layers 60 and 74 in FIG. 14) using HF. Finally, the first nitride layer 54 is deposited in the focusing cavity 34 to maintain the co-planarity of the bottom surfaces of the focusing and device cavities, 34 and 36 as each cavity is being filled in by a series of successively deposited material layers (excluding photoresist layers) that are required for forming the MEMS device. Since the top surface of each succeeding material layer reforms a new bottom surface for each cavity, the position of the focusing and reflected light beams, 32 and 32', is vertically displaced after deposition of each material layer so that the projection stepper 10 repositions the wafer 22 so that the top surface of each material layer coincides with the image plane of the projected reticle image 12 as shown in FIGS. 5, 7, 9 and 12.

In FIG. 5, a first polysilicon layer 56 is deposited above the first nitride layer 54 and is patterned by etching through a mask formed by exposing and developing an overlying second photoresist layer 58. The presence of the deposited layers 54 and 56 within the focusing cavity 34 acts to raise the first bottom surface 38 of the focusing cavity 34 by the same amount that the layers 54 and 56 raise the second bottom surface 42 of the device cavity 36. As a result, the focusing light beam 32 is reflected off the top surface of the first polysilicon layer 56 (which now defines the first surface 38) after traversing the second photoresist layer 58 which does not substantially absorb the focusing light beam 32. The reflected light beam 32' provides a detected light signal for automatically servoing the vertical position of the wafer chuck 24 of the projection stepper 10 (see FIG. 1) to relocate the top surface of the first polysilicon layer 56 at the focal plane of the projected image 12, thereby placing the second photoresist layer 58 within the depth of field of the stepper 10 prior to exposing the second photoresist layer 58. This allows the first polysilicon layer 56 to be precisely patterned with device features formed therein at a resolution down to the resolution limit of the stepper 10.

Figure 6:
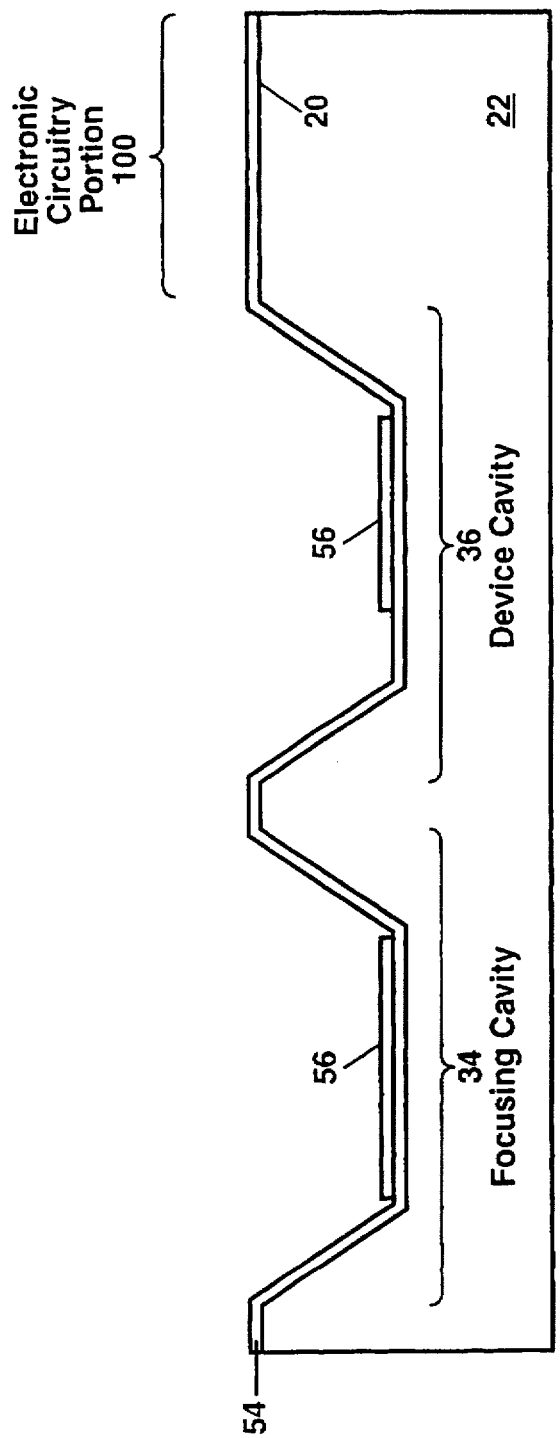

The first polysilicon layer 56 can be doped after deposition by an ion implantation or thermal diffusion process step for use in forming a ground or voltage reference plane for the MEMS device formed in device cavity 36, or for providing electrical connections between elements or device features of the MEMS device. FIG. 6 shows the first polysilicon layer 56 after patterning by etching in this example of the present invention. In FIG. 6, the portion of the first polysilicon layer 56 within the focusing cavity 34 can also be patterned to provide a substantially planar sheet of the material, or to form alignment marks within the first polysilicon layer 56.

Figure 7:
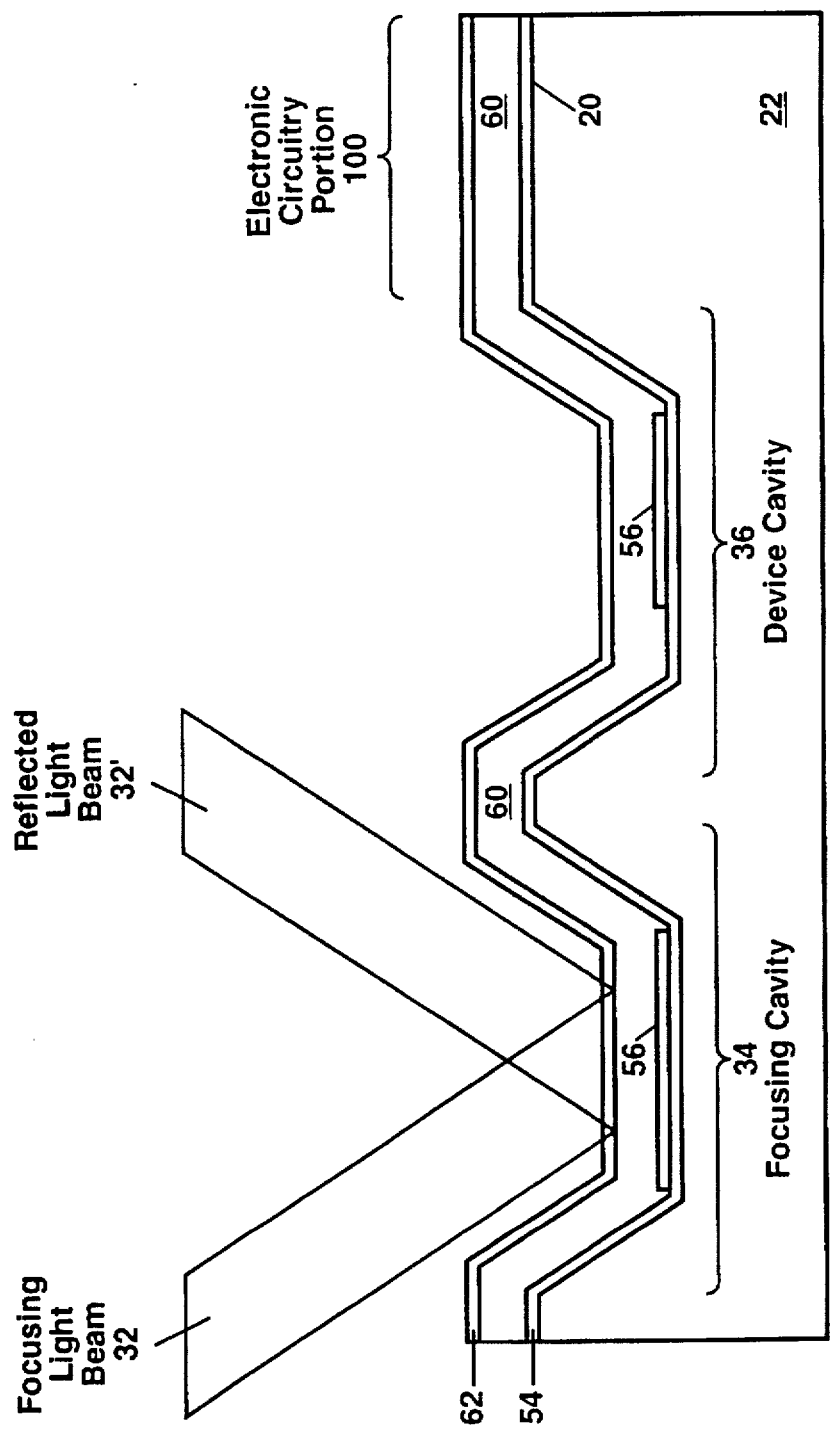

In FIG. 7, a first sacrificial oxide layer 60 comprising silicon dioxide or a silicate glass such as TEOS is deposited by a chemical vapor deposition (CVD) process to blanket the wafer 22. The CVD process can be based either on the decomposition of an oxide or silicate glass layer-forming gas, or by a plasma-enhanced CVD process (PECVD) wherein applied radio-frequency (rf) power is provided within a deposition chamber to assist the decomposition of the layer-forming gas in order to deposit the first sacrificial oxide layer 60 at a reduced temperature of about 600° C. or less. The first sacrificial oxide layer 60 can be up to a few microns thick and is used for anchoring and separating various elements or device features of the MEMS device to be formed in device cavity 36. Later, after forming the electronic circuitry on portion 100 of the wafer 22, the first sacrificial oxide layer 60 and any other sacrificial oxide layers (e.g. a second sacrificial oxide layer 74) can be removed in part or entirely by etching with HF. Removal of these sacrificial oxide layers releases the MEMS device for operation or movement.

The deposited first sacrificial oxide layer 60 raises the first surface of cavity 34 and the second surface of cavity 36 by an amount equal to the thickness of the deposited layer 60. The focusing light beam 32 within the focusing cavity 34 can then be used to generate a detected light signal for servoing or repositioning the vertical position of the wafer 22 so that the focal plane of the projected reticle image 12 coincides with the top surface of the first sacrificial oxide layer 60. This allows a third photoresist layer 62 spun over the first sacrificial oxide layer 60 to be precisely exposed for defining device features in the underlying first sacrificial oxide layer 60 with lateral dimensions as small as the resolution limit of the projection stepper 10.

Figure 8:
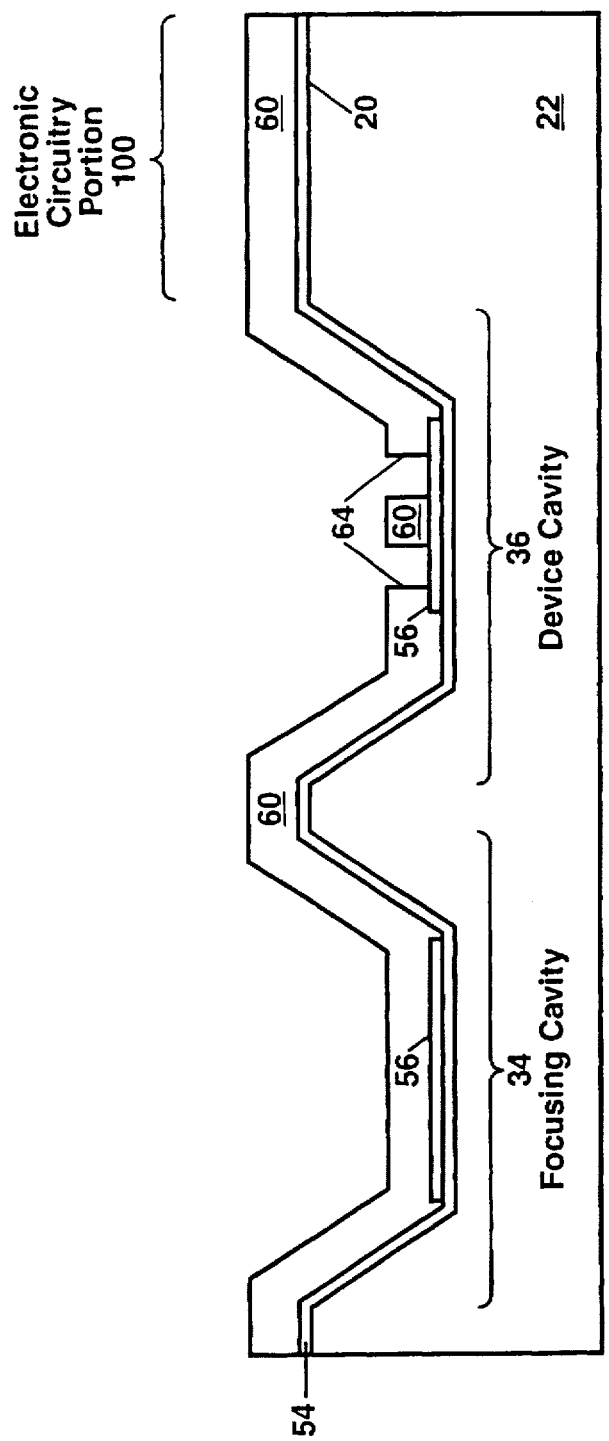
Figure 9:
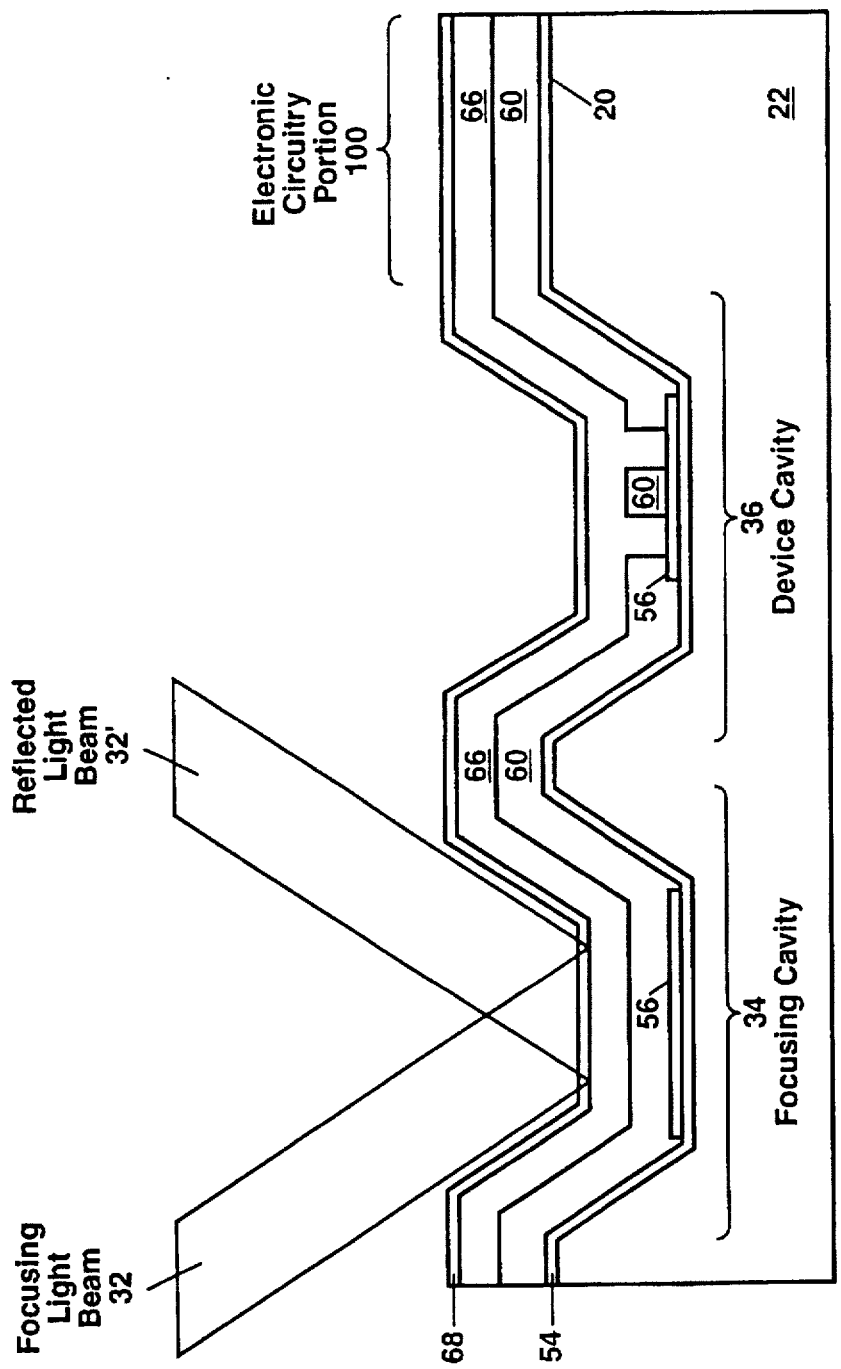

FIG. 8 shows the first sacrificial oxide layer 60 after patterning by etching. In FIG. 8, a pair of openings 64 are formed so that the first polysilicon layer 56 can be electrically and mechanically interconnected to a second polysilicon layer 66 that is deposited over the first sacrificial oxide layer 60 as shown in FIG. 9. The second polysilicon layer 66 can be about 2 µm thick, in this example.

In FIG. 9, a fourth photoresist layer 68 is spun on over the wafer 22 to blanket the second polysilicon layer 66 and a 500-nanometer-thick TEOS layer (not shown) thereabove for forming a hard etch mask. Prior to exposing the fourth photoresist layer 68, the wafer 22 is vertically repositioned by the stepper 10 using the focusing and reflected light beams, 32 and 32', so that the focal plane of the projected reticle image 12 coincides with first surface 38 which is now defined by the top surface of TEOS layer covering the second polysilicon layer 66. This allows the fourth photoresist layer 68 to be exposed with a predetermined reticle pattern and developed for use in dry etching through the TEOS layer, thereby forming the hard etch mask. The fourth photoresist layer 68 is then removed, and the hard etch mask is used for dry etching the second polysilicon layer 66 and precisely defining features therein for the MEMS device being formed within the device cavity 36. After patterning the second polysilicon layer 66, the TEOS hard etch mask is removed by selective etching. This approach is also used for patterning any subsequent polysilicon layers for forming the MEMS device in the device cavity 36.

Figure 10:
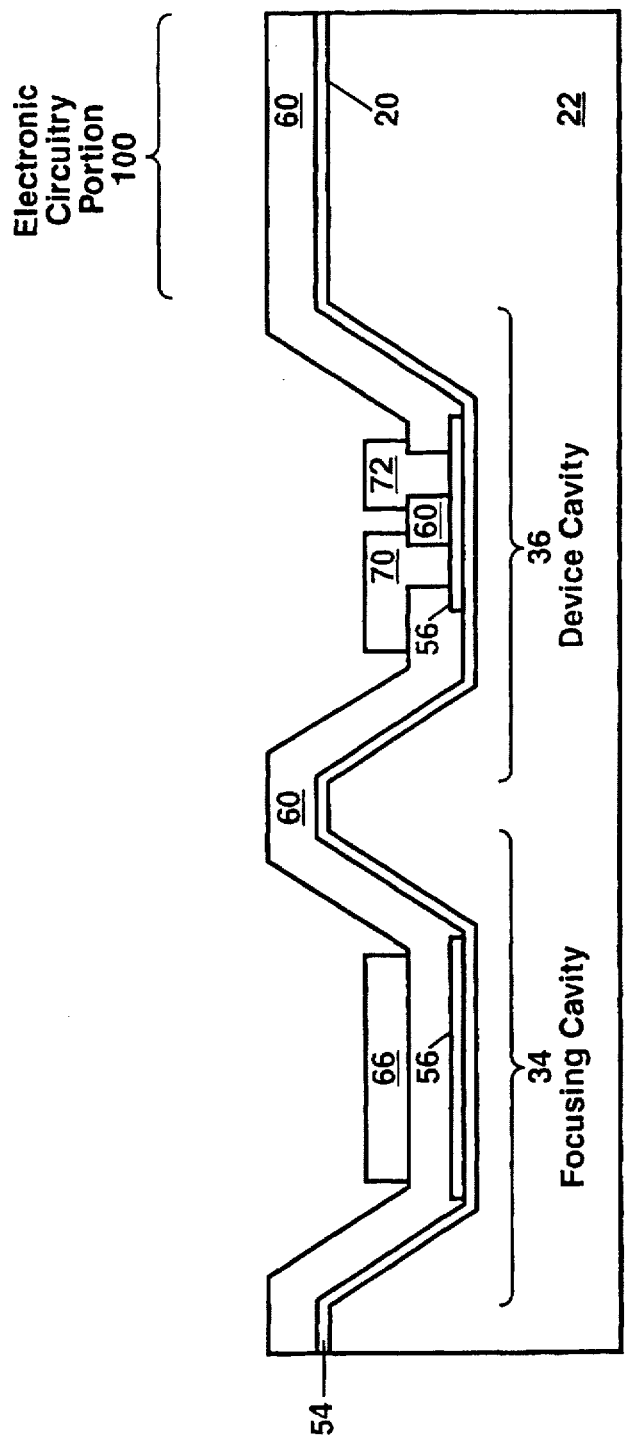

FIG. 10 shows representative device features defined in the second polysilicon layer 66. These device features, in the case of an accelerometer, can include a plurality fixed support beams 70 and moveable support beams (not shown), and electrical interconnection studs 72 for forming electrical connections to a ground or voltage reference plane or to electronic circuitry. In other types of MEMS devices, the second polysilicon layer 66 can be used for forming rotary members, hinged members, linear actuators, pressure diaphragms or the like with predetermined forms or shapes depending upon a particular MEMS device to be fabricated. In FIG. 10, a portion of the second polysilicon layer 66 is retained within the focusing cavity 34 to maintain the co-planarity of the bottom surfaces of the focusing and device cavities, 34 and 36, which are now defined by the top surface of layer 66.

Figure 11:
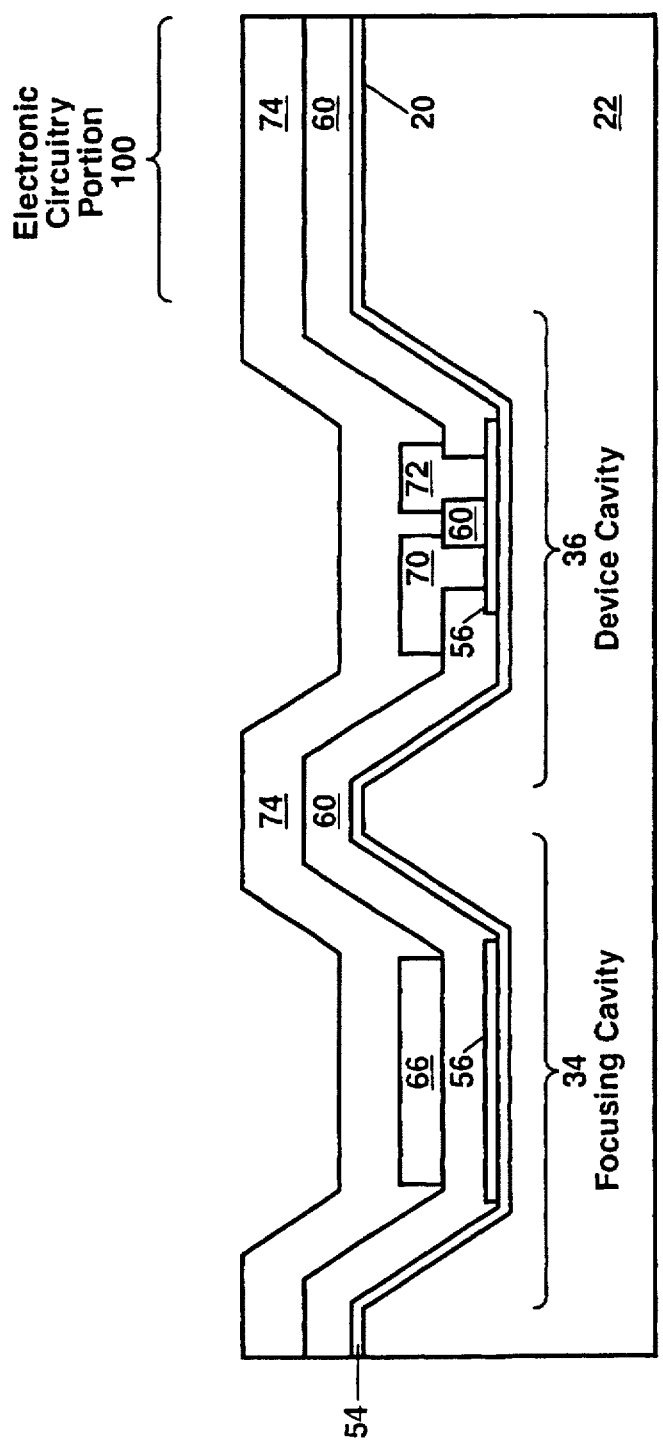

In FIG. 11, a second sacrificial oxide layer 74 is deposited by CVD or PECVD to further encapsulate the MEMS device formed in the device cavity 36. The second sacrificial oxide layer 74 in this example is sufficiently thick to fill in the focusing and device cavities, 34 and 36, above the level of the surface 20 of wafer 22, and preferably above the portion of the first nitride layer 54 lying above the surface 20. A step for planarizing the wafer 22 is then provided, preferably using chemical-mechanical polishing (CMP). During the wafer planarization process, the portion of the first nitride layer 54 above the surface 20 can be used as a stop to limit the downward extent of the chemical-mechanical polishing. The result after the chemical-mechanical polishing step is a planarized wafer with the focusing and device cavities, 34 and 36, completely filled in so that the MEMS device is encapsulated.

Figure 12:
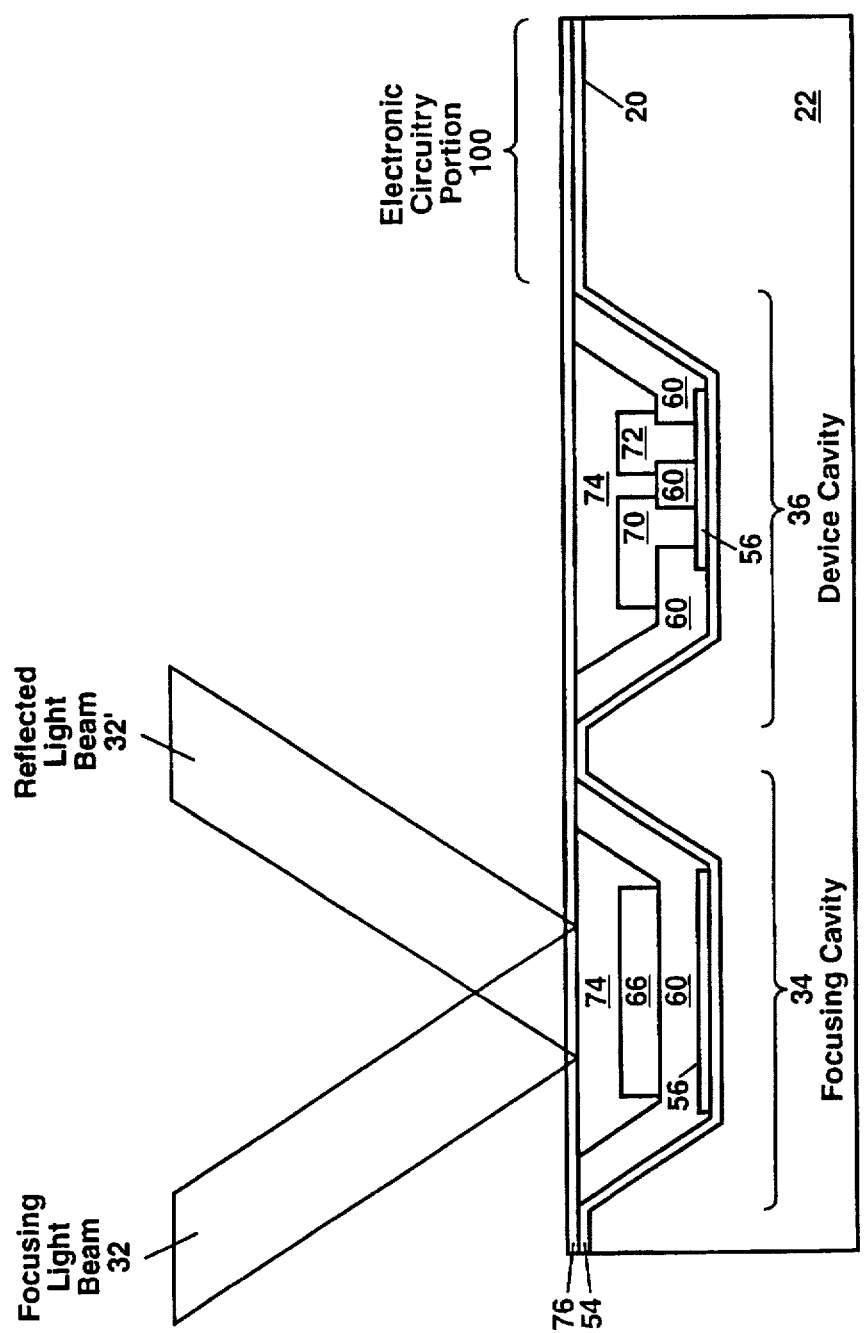

The planarized wafer can then be overcoated with a fifth photoresist layer 76 as shown in FIG. 12 to pattern an mask for use in etching one or more openings through the second sacrificial oxide layer 74 at the location of each electrical interconnection stud 72. These openings will be used later for interconnecting the MEMS device with electronic circuitry formed on the portion 100 of the wafer 22. Since the entire top surface of the wafer 22 is planarized at the time of this photolithography step, the auto-focusing projection stepper 10 uses the focusing light beam 32 to bring the planarized top surface of the wafer into focus with a projected reticle image 12 in a manner similar to that previously described for FIG. 1.

Figure 13:
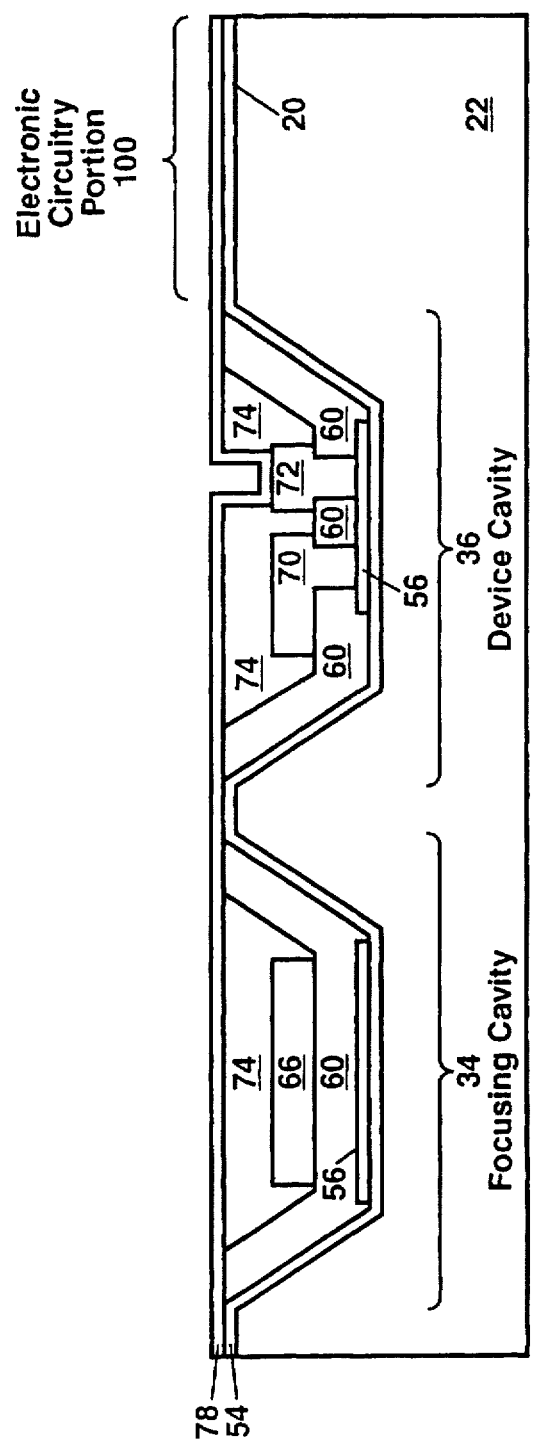

After forming the opening to each electrical interconnection stud 72, the wafer 22 can then be overcoated with a deposited second nitride layer 78 (e.g. by LPCVD) as shown in FIG. 13. The second nitride layer 78 with a thickness of about 120 nanometers forms a nitride-to-nitride seal about the focusing cavity 34 and the device cavity 36 for sealing the two cavities during an annealing step, and during subsequent processing steps for forming electronic circuitry on portion 100 of the wafer 22. The annealing step is performed by heating the wafer 22 to a predetermined temperature in the range of about 700°–1300° for sufficient time to relieve any stress within each MEMS device. Alternately, the annealing step can be performed during a thermal cycle used for fabricating the electronic circuitry (e.g. during one or more thermal diffusion steps for forming transistors).

To form the electronic circuitry on the portion 100 of the wafer 22, the first and second nitride layers (54 and 78) and the thermal oxide formed over the surface 20 are removed from the electronic circuitry portion 100 by etching. New thermal oxide and nitride layers can then be formed on the portion 100 with precise thicknesses as required for carrying out a set of standard processes for forming electronic circuitry.

Figure 14:
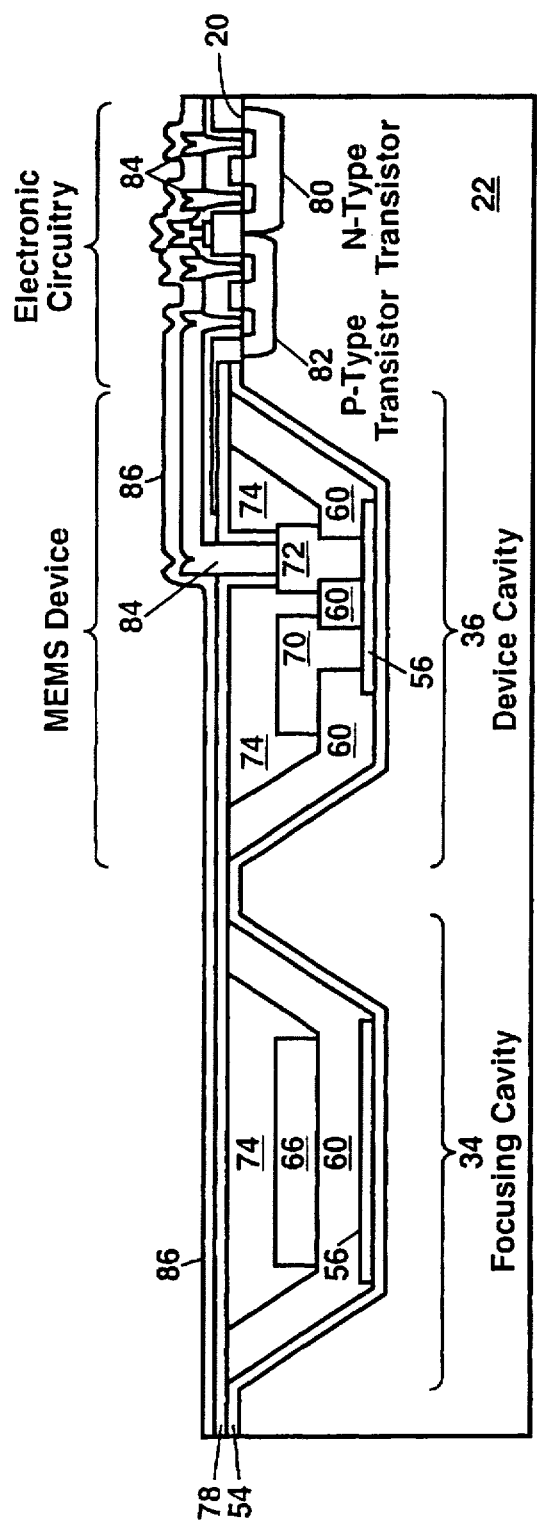

The set of processes used for forming the electronic circuitry (e.g. CMOS, BiCMOS, or bipolar circuitry) are believed to be well known and, therefore, are not described herein in detail. Furthermore, critical device features (e.g. gates) to be defined in one or more first-formed material layers of n-type transistors 80 and p-type transistors 82 are generally formed on or near the surface 20 of the wafer 22 as shown in FIG. 14 with topography variations that are small compared within the depth of focus of the projection stepper 10 so that these critical device features can be formed at the resolution limit of the stepper 10. Other last-formed layers of the electronic circuitry (e.g. one or more layers of interconnect metallization 84) can in some instances lie above the depth of focus of the projection stepper 22 so that these last-formed layers will be patterned with a resolution somewhat poorer than the limit of resolution of the stepper 22. However, critical tolerances in these last-formed layers are generally less demanding so that the poorer resolution in these last-formed layers does not seriously impair performance of the electronic circuitry.

Alternately, according to the method of the present invention, each step for depositing a material layer within the electronic circuitry portion 100 of the wafer 22 can include a simultaneous deposition of the same material layer above the focusing cavity 34 so that the focusing and reflected light beams, 32 and 32', can be used to servo the vertical position of the wafer chuck 24 and keep each deposited material layer at the focal plane of the projection stepper. As a result, each photolithographic step for defining device features can now be performed at the resolution limit of the stepper 10.

In FIG. 14, to complete the formation of the electronic circuitry, one or more layers of interconnect metallization 84 are deposited and patterned after etching an opening through the second nitride layer 78 at the location of each electrical interconnection stud 72. The layers of interconnect metallization 84, separated by dielectric layers (e.g. silicate glass) serve to interconnect electrical elements of the electronic circuitry 100 and to form electrical interconnections to the MEMS device within device cavity 36.

Figure 15:
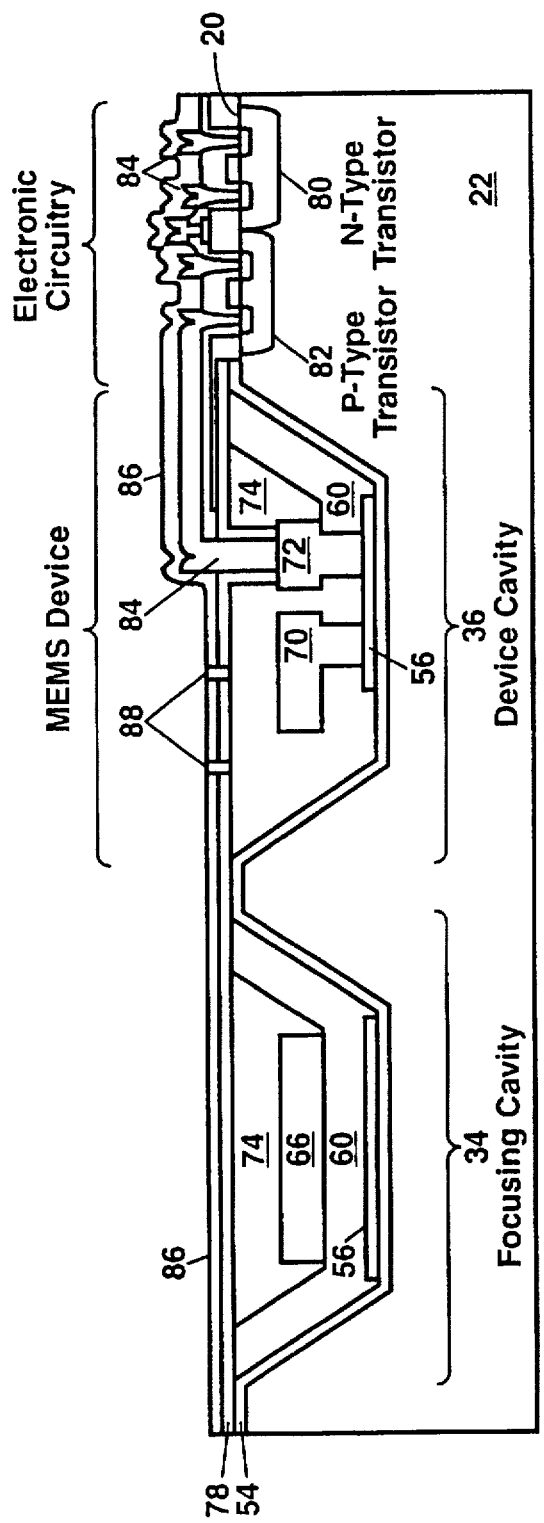

After deposition and patterning of the interconnect metallization 84, the wafer 22 in this example can be overcoated with one or more protective layers 86 (e.g. silicon nitride, polyimide, photoresist) that are chemically resistant to HF to protect the electronic circuitry 100 during a release etch step for etching away the sacrificial oxide layers, 60 and 74, thereby releasing the MEMS device encapsulated in the device cavity 36. Prior to the etch release step, one or more openings are formed through the various layers above the second sacrificial oxide layer 74 in the device cavity 36 to provide access for an oxide etchant comprising HF that is used to dissolve away a portion or all of the sacrificial oxide layers, 60 and 74. The HF etchant dissolves the sacrificial oxide layers, 60 and 74, but preferably does not attack other material layers (e.g. polysilicon, silicon nitride or metals) forming elements of the MEMS device. After the etch release step, the openings provided for releasing the MEMS device can be plugged (e.g. with deposited silicon nitride plugs 88) as shown in FIG. 15. The protective layer 86 can then be removed, at least in part, over the electronic circuitry 100 to expose a plurality of bonding pads, or for a subsequent deposition of a passivation layer (e.g. a silicate glass) over the electronic circuitry 100 for protection and stress relief.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for photolithographically defining device features recessed below a surface of a semiconductor wafer using an auto-focusing photolithographic stepper exposure system comprising steps for:

(a) forming a plurality of equal-depth cavities within a die field on a top surface of the semiconductor wafer, including a focusing cavity formed at a predetermined position of a focusing light beam from the auto-focusing photolithographic stepper exposure system and at least one device cavity proximate to the focusing cavity;

(b) forming a material layer within each cavity, thereby raising a bottom surface of each cavity by a thickness of the material layer;

(c) covering the material layer with a photoresist layer;

(d) focusing the photolithographic stepper exposure system by reflecting the focusing light beam off the material layer in the focusing cavity and generating a detected light signal for vertically positioning the bottom surface of each cavity at a focal plane of the stepper exposure system; and (e) exposing the photoresist layer for photolithographically defining the recessed device features to be formed in the material layer within the device cavity.

2. The method of claim 1 wherein the step for forming the plurality of equal-depth cavities comprises forming the cavities by a bulk micromachining process.

3. The method of claim 2 wherein the semiconductor wafer comprises silicon, and the bulk micromachining process comprises etching with an anisotropic etchant selected from the group consisting of potassium hydroxide (KOH), tetramethyl ammonium hydroxide (TMAH) and ethylenediamine pyrocatechol (EDP).

4. The method of claim 1 further including steps for providing at least one alignment mark within the die field, and laterally aligning the wafer to a projected reticle image prior to exposing the photoresist layer.

5. The method of claim 4 wherein at least one alignment feature is located within the focusing cavity.

6. The method of claim 5 wherein the step for laterally aligning the wafer to the projected reticle image comprises reflecting an alignment light beam off the alignment mark within the focusing cavity and generating a detected alignment signal for laterally positioning the semiconductor wafer.

7. The method of claim 1 further including steps for building up a device structure in the device cavity by depositing additional material layers of predetermined thicknesses and compositions within the focusing and device cavities, each additional material layer being photolithographically defined by a photoresist layer provided thereover, and each additional material layer further raising the bottom surface of each cavity so that the semiconductor wafer is vertically repositioned in the stepper by the detected light signal to locate the bottom surface of each cavity at the focal plane of the stepper exposure system prior to exposing the photoresist layer and defining the device features.

8. The method of claim 7 wherein the device structure comprises a microelectromechanical system.

9. The method of claim 7 wherein each layer of the device structure is photolithographically defined with a resolution about equal to a resolution limit of the stepper exposure system.

10. The method of claim 9 wherein the device structure comprises device features having at least one lateral dimension of <1 micron.

11. The method of claim 7 further including steps for forming electronic circuitry on the surface of the semiconductor wafer, the electronic circuitry including electrical interconnections to the device structure.

12. The method of claim 11 wherein the device structure comprises a microelectromechanical system.

13. The method of claim 11 wherein the electronic circuitry is formed with a resolution about equal to a resolution limit of the stepper exposure system.

14. The method of claim 13 wherein the electronic circuitry comprises sub-micron device features.

15. A product formed according to the method of claim 7.

16. A method for forming a microelectromechanical system (MEMS) device in a cavity below the surface of a semiconductor wafer, comprising steps for:

(a) forming a plurality of equal-depth cavities within a die field on the semiconductor wafer, including a focusing cavity located at a predetermined position in the die field corresponding to the position of a focusing light beam from an auto-focusing photolithographic stepper, and at least one device cavity wherein the MEMS device is to be formed;

(b) depositing a plurality of material layers, one layer at a time, into the focusing and device cavities;

(c) forming a patterned mask over each material layer for defining features of the MEMS device within the material layer by automatically focusing the stepper at a top surface of the material layer in the focusing cavity; and (d) etching the material layer through the patterned mask to form the features of the MEMS device within the device cavity.

17. The method of claim 16 wherein the semiconductor wafer comprises silicon, and the step of forming the plurality of equal-depth cavities comprises etching with an anisotropic etchant selected from the group consisting of potassium hydroxide (KOH), tetramethyl ammonium hydroxide (TMAH) and ethylenediamine pyrocatechol (EDP).

18. The method of claim 16 wherein the step for automatically focusing the stepper at the surface of the material layer comprises reflecting a focusing light beam off the top surface of the material layer in the focusing cavity and generating a detected light signal for vertically positioning the top surface of the material layer at a focal plane of the stepper.

19. The method of claim 16 wherein at least one feature of the MEMS device has a lateral dimension of less than one micron.

20. The method of claim 16 wherein at least one feature of the MEMS device is formed with a lateral dimension that is about equal to a resolution limit of the stepper.

21. The method of claim 20 wherein the stepper has a numerical aperture (N. A.) in the range of 0.3–0.6.

22. The method of claim 16 further including a step for laterally aligning the die field to a projected reticle image from the stepper by providing at least one alignment mark within the focusing cavity.

23. The method of claim 22 wherein the step for laterally aligning the die field to the projected reticle image from the stepper is performed automatically by reflecting an alignment light beam off the alignment mark within the focusing cavity and generating a detected alignment signal for laterally positioning the semiconductor wafer.

24. The method of claim 16 further including steps for forming electronic circuitry on the surface of the semiconductor wafer and interconnecting the electronic circuitry with the MEMS device.

25. A MEMS device formed according to the method of claim 16.

26. A MEMS device formed according to the method of claim 24.

27. A method for photolithographically defining device features recessed below a surface of a semiconductor wafer by a distance exceeding a depth of field of an auto-focusing photolithographic stepper, comprising steps for:

(a) forming a plurality of equal-depth cavities within the semiconductor wafer with a depth greater than the depth of field of the auto-focusing photolithographic stepper exposure system, the plurality of cavities including a focusing cavity centralized within a die field on the wafer, and at least one device cavity proximate to the focusing cavity;

(b) depositing a photoresist layer to blanket the bottom surfaces of each cavity; and (c) focusing a projected light image for exposing the photoresist layer by reflecting a focusing light beam of the auto-focusing stepper off the bottom surface of the focusing cavity, thereby photolithographically defining the recessed device features within each device cavity.

* * * * *